(12) United States Patent
Yazaki (10) Patent No.: US 10,004,144 B2
(45) Date of Patent: Jun. 19, 2018

(54) CONNECTOR MODULE

(71) Applicant: Murata Manufacturing Co., Ltd., Nagaokakyo-shi, Kyoto-fu (JP)

(72) Inventor: Hirokazu Yazaki, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days. days.

(21) Appl. No.: 15/487,454

(22) Filed: Apr. 14, 2017

(65) Prior Publication Data

US 2017/0223836 A1    Aug. 3, 2017

Related U.S. Application Data

(63) Continuation of application No. PCT/JP2015/080983, filed on Nov. 4, 2015.

(30) Foreign Application Priority Data

Nov. 7, 2014  (JP) ................. 2014-226636

(51) Int. Cl.
*H05K 1/02* (2006.01)
*H05K 1/18* (2006.01)
(Continued)

(52) U.S. Cl.
CPC ......... *H05K 1/185* (2013.01); *H01F 27/2804* (2013.01); *H01F 27/29* (2013.01);
(Continued)

(58) Field of Classification Search
CPC . H05K 1/0233; H05K 9/0075; H05K 2201/08
See application file for complete search history.

(56) References Cited

U.S. PATENT DOCUMENTS 8,791,372 B2 * 7/2014 Harvey ............... H05K 1/0233
                                                        174/262
9,106,313 B2    8/2015 Ueki et al.
(Continued)

FOREIGN PATENT DOCUMENTS

JP    2000-269613 A    9/2000
JP    2005-229434 A    8/2005
(Continued)

OTHER PUBLICATIONS

Official Communication issued in International Patent Application No. PCT/JP2015/080983, dated Jan. 19, 2016.
(Continued)

*Primary Examiner* — Jeremy C Norris
(74) *Attorney, Agent, or Firm* — Keating & Bennett, LLP (57) ABSTRACT

A connector module includes a substrate including stacked magnetic layers, a first principal surface, and a second principal surface opposite to the first principal surface, a surface mount connector mounted on mounting electrodes on the first principal surface of the substrate, external mounting electrodes disposed on the second principal surface of the substrate, and inductors inside the substrate and each connected at a first end thereof to a corresponding one of the mounting electrodes and connected at a second end thereof to a corresponding one of the external mounting electrodes.

19 Claims, 9 Drawing Sheets

(51) Int. Cl.
*H01F 27/28* (2006.01)
*H01F 27/29* (2006.01)
*H01R 12/70* (2011.01)
*H01R 12/71* (2011.01)
*H01R 12/77* (2011.01)
*H01R 12/79* (2011.01)

(52) U.S. Cl.
CPC ....... *H01R 12/7082* (2013.01); *H01R 12/716* (2013.01); *H01R 12/777* (2013.01); *H01R 12/79* (2013.01); *H01F 2027/2809* (2013.01)

(56) References Cited

U.S. PATENT DOCUMENTS

2005/0205295 A1* 9/2005 Tsuk .................... H05K 1/0233
174/256
2015/0294781 A1 10/2015 Yosui et al.

FOREIGN PATENT DOCUMENTS

| JP | 2005-302810 A | 10/2005 |
| WO | 2012/153691 A1 | 11/2012 |
| WO | 2014/129279 A1 | 8/2014 |

OTHER PUBLICATIONS

Official Communication issued in Japanese Patent Application No. 2016-557767, dated Oct. 3, 2017.

* cited by examiner

CONNECTOR MODULE

CROSS REFERENCE TO RELATED APPLICATIONS

This application claims the benefit of priority to Japanese Patent Application No. 2014-226636 filed on Nov. 7, 2014 and is a Continuation Application of PCT Application No. PCT/JP2015/080983 filed on Nov. 4, 2015. The entire contents of each application are hereby incorporated herein by reference.

BACKGROUND OF THE INVENTION

1. Field of the Invention

The present invention relates to a connector module including a connector for connection to a flexible cable.

2. Description of the Related Art

A mother substrate and a sub-substrate included in an electronic device, such as an information communication device, are connected to each other by a flexible cable (flexible printed circuits (FPC)) therebetween. A problem here is that since high-frequency noise radiated from a high-frequency circuit is superimposed on signal lines of the flexible cable, the noise is superimposed on patterns on the substrates and adversely affects other circuit elements. As a solution to this, a ferrite bead (inductance element) is provided on patterns on a substrate to suppress undesired noise (see, e.g., Japanese Unexamined Patent Application Publication No. 2000-269613). Japanese Unexamined Patent Application Publication No. 2000-269613 discloses a configuration in which a ground pattern and a connector connection pattern on a substrate are connected to each other by a ferrite bead.

The technique disclosed in Japanese Unexamined Patent Application Publication No. 2000-269613 requires space to mount the ferrite bead on the substrate. This means that as the number of ferrite beads increases, the space required to mount also increases. At the same time, it is difficult to mount the ferrite bead.

SUMMARY OF THE INVENTION

Preferred embodiments of the present invention provide a connector module that eliminates the problem of mounting an inductance element and achieves space saving.

A connector module according to a preferred embodiment of the present invention includes a connector, a substrate including a plurality of magnetic layers and a first principal surface and a second principal surface opposite to each other, at least one connector connection terminal disposed on the first principal surface of the substrate, the connector connection terminal being a terminal on which the connector is mounted, at least one first external connection terminal disposed on the second principal surface of the substrate, and at least one inductance element provided inside the magnetic layers and disposed between the connector connection terminal and the first external connection terminal.

With this configuration, with the inductance element being provided inside the substrate with the connector mounted thereon, there is no need to mount a separate inductance element on a printed circuit board onto which the connector module is to be mounted. Therefore, it is not necessary to create space on the printed circuit board to mount an inductance element, and it is possible to avoid the problem of mounting it.

The connector module preferably includes a plurality of connector connection terminals, a plurality of first external connection terminals provided on the second principal surface to correspond to the respective connector connection terminals, and a plurality of inductance elements provided inside the substrate, the inductance elements each being positioned between a corresponding one of the connector connection terminals and a corresponding one of the first external connection terminals.

With this configuration, even when the number of inductance elements increases, there is no need to create space on the printed circuit board to mount each of the inductance elements, and it is possible to avoid the problem of mounting them.

Preferably, the connector connection terminals are provided at locations spaced in a predetermined direction of the first principal surface, the first external connection terminals are arranged at positions opposite the respective connector connection terminals, and the inductance elements are provided between the connector connection terminals and the first external connection terminals.

This configuration enables effective use of space and facilitates formation of a plurality of inductance elements.

The connector module may include a plurality of connector connection terminals, a plurality of first external connection terminals may be provided on the second principal surface to correspond to the respective connector connection terminals, at least one of the connector connection terminals and at least one of the first external connection terminals may be connected, with the inductance element interposed therebetween, and the at least one of the connector connection terminals and the at least one of the first external connection terminals may be connected by a wire routed along a side surface of the substrate.

With this configuration, the inductance element may be provided only where necessary.

The inductance element preferably includes a coil conductor pattern wound around a winding axis parallel or substantially parallel to a stacking direction of the magnetic layers, for example.

This configuration reduces unnecessary wire routing and facilitates formation of the inductance element.

The connector module preferably further includes a ground conductor provided in the substrate and overlapping the inductance element in a stacking direction of the magnetic layers.

In this configuration, the ground conductor overlaps the inductance element and this generates a capacitance therebetween. This capacitance and the inductance component of a wire routed to connect the ground conductor to the ground defines a filter (low pass filter). Thus, a connector module including a filter function is provided.

The ground conductor is preferably disposed between the inductance element and the first principal surface.

With this configuration, with the ground conductor positioned between the inductance element and the first principal surface, the inductance element is shielded from the connector mounted on the first principal surface.

The connector module preferably further includes a second external connection terminal disposed on the second principal surface of the substrate, and an interlayer connection conductor provided in the substrate and configured to connect the ground conductor to the second external connection terminal.

In this configuration, the interlayer connection conductor is long, because the ground conductor is provided above the inductance element (i.e., adjacent to the first principal surface). This increases the inductance component.

With various preferred embodiments of the present invention, there is no need to create space to mount an inductance element on the printed circuit board onto which the connector module is to be mounted, and it is possible to avoid the problem of mounting the inductance element.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 1:
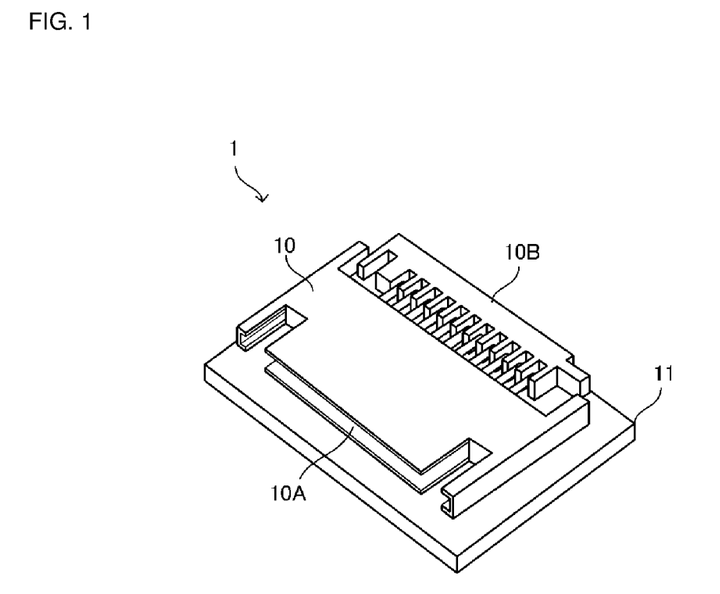
FIG. 1 is a perspective view of a connector module according to a first preferred embodiment of the present invention.
Figure 2:
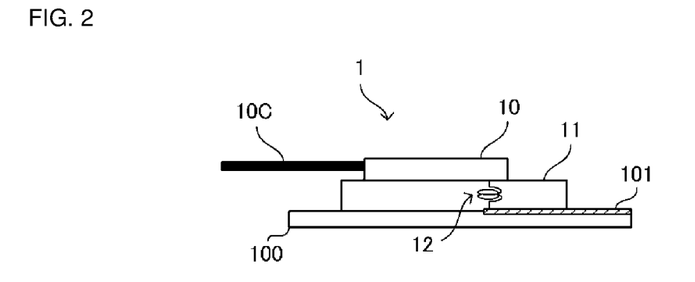
FIG. 2 illustrates the connector module mounted on a printed circuit board.
Figure 3:
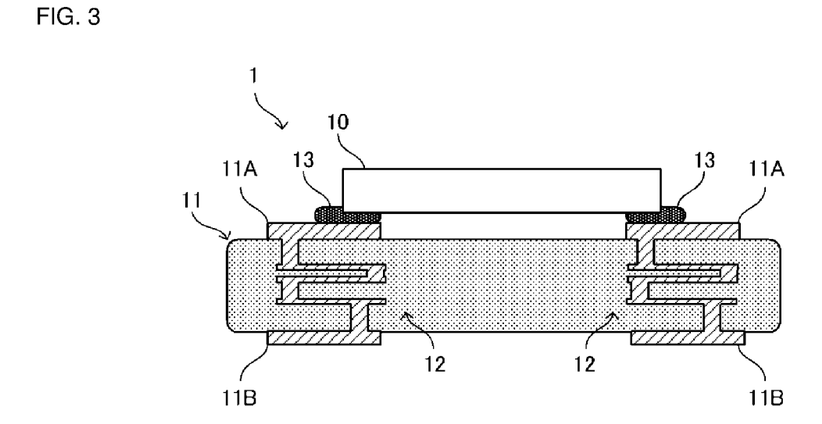
FIG. 3 is a cross-sectional view of the connector module.

FIG. 1 is a perspective view of a connector module 1 according to a first preferred embodiment of the present invention. FIG. 2 illustrates the connector module 1 mounted on a printed circuit board 100. FIG. 3 is a cross-sectional view of the connector module 1.

The connector module 1 includes a surface mount connector 10 and a substrate 11 integral with each other. The surface mount connector 10 according to the present preferred embodiment is a female connector to and from which a male connector connected to a flexible cable 10C is attached and detached. Specifically, the surface mount connector 10 is preferably a horizontal insertion type surface mount connector including an insertion slot 10A on one side to receive the flexible cable 10C and a retainer 10B on the other side to retain the inserted flexible cable 10C. The surface mount connector 10 corresponds to a "connector" according to a preferred embodiment of the present invention. The surface mount connector 10 may be a vertical insertion type connector, and the flexible cable 10C does not necessarily need to include a connector. The flexible cable 10C is preferably a multi-wire cable including a bundle of wires in the present preferred embodiment, but it may be a single-wire cable including only one wire.

The substrate 11 includes a plurality of magnetic layers that are stacked. Mounting electrodes 11A that mount the surface mount connector 10 thereon are provided on one principal surface (first principal surface in the present preferred embodiment) of the substrate 11. Although FIG. 3 shows only two mounting electrodes 11A for the surface mount connector 10, the surface mount connector 10 includes a plurality of connection terminal pins corresponding to the number of wires, and the number of mounting electrodes 11A is the same as that of the connection terminal pins. In the connector module 1 of the present preferred embodiment, the surface mount connector 10 preferably includes 11 connection terminal pins as described below. The mounting electrodes 11A are connected by solder 13 to the respective connection terminal pins. The mounting electrodes 11A correspond to a "connector connection terminal" according to a preferred embodiment of the present invention.

External mounting electrodes 11B to be mounted on the printed circuit board 100 are provided on the other principal surface (second principal surface in the present preferred embodiment) of the substrate 11. A wiring pattern 101 is provided on the printed circuit board 100. The connector module 1 is mounted on the printed circuit board 100 preferably by soldering the external mounting electrodes 11B to the wiring pattern 101. The external mounting electrodes 11B preferably equal in number to the mounting electrodes 11A are provided at positions opposite the respective mounting electrodes 11A. The external mounting electrodes 11B correspond to a "first external connection terminal" according to a preferred embodiment of the present invention.

The substrate 11 includes coil-shaped inductors 12. The inductors 12 are each wound around a winding axis parallel or substantially parallel to the stacking direction of the magnetic layers. The inductors 12 are preferably equal in number to the mounting electrodes 11A and the external mounting electrodes 11B. The inductors 12 are each connected at a first end thereof to a corresponding one of the mounting electrodes 11A and connected at a second end thereof to a corresponding one of the external mounting electrodes 11B. The inductors 12 do not necessarily need to be included in all wires, as long as they are provided for the necessary wires. A wire provided with no inductor 12 may be routed from the one principal surface to the other principal surface of the substrate 11 by a via-hole conductor inside the substrate 11, or may be routed by a side conductor along the side surface of the substrate 11. As described below, to eliminate an unnecessary inductance component in a ground line or other line, the wire is preferably routed along the side surface of the substrate 11.

Figure 4:
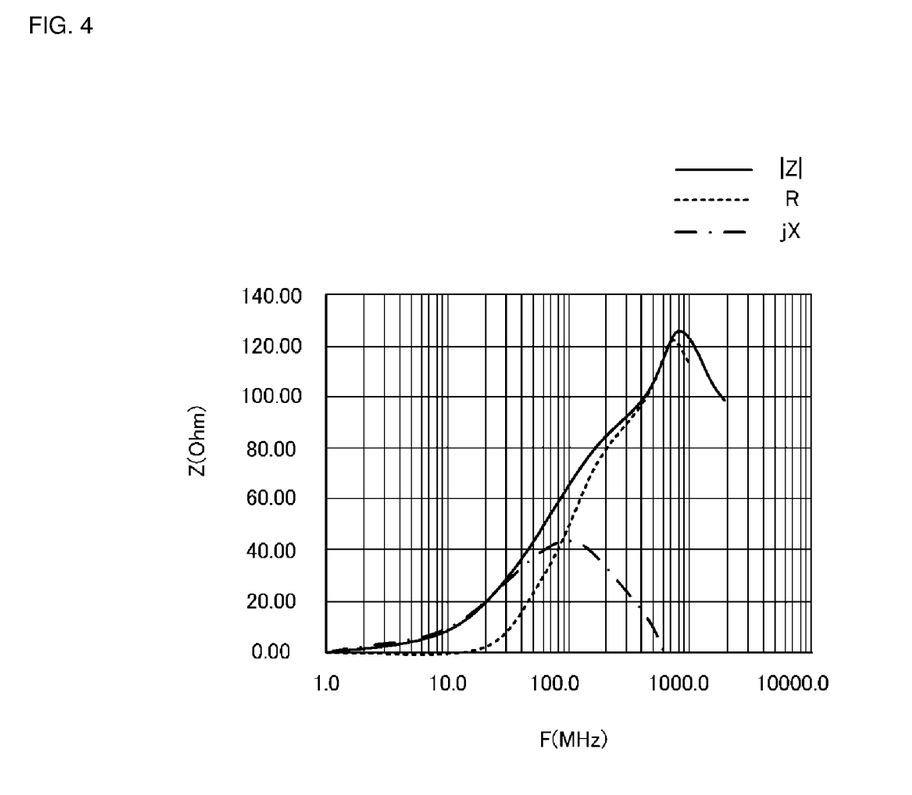
FIG. 4 is a graph showing characteristics of inductors included in the connector module.

FIG. 4 is a graph showing characteristics of the inductors 12 included in the connector module 1. The inductors 12 included in the connector module 1 configured as described above have impedance frequency characteristics shown in FIG. 4. With this connector module 1, the inductors 12 are positioned between the surface mount connector 10 and the wiring pattern 101 on the printed circuit board 100. As can be seen in FIG. 4, the value of impedance Z increases as the frequency increases, and the inductors 12 define and function as a low pass filter for the wires. When a ferrite material having a high loss in a high-frequency region is used for the magnetic layers, a resistance component R becomes dominant over a reactance component X in the high-frequency region. That is, the inductors 12 suppress high-frequency noise superimposed on signal lines of the flexible cable 10C.

When the inductors 12 for noise suppression are provided in the substrate 11 to be integral with the surface mount connector 10, there is no need to mount an inductance element on the printed circuit board 100. Accordingly, there is no need to create space to mount an inductance element, and it is possible to avoid the trouble of mounting an inductance element.

The substrate 11 and the inductors 12 of the connector module 1 are illustrated in a simplified manner in FIG. 3. A detailed description of the substrate 11 and the inductors 12 is provided below.

Figure 5:
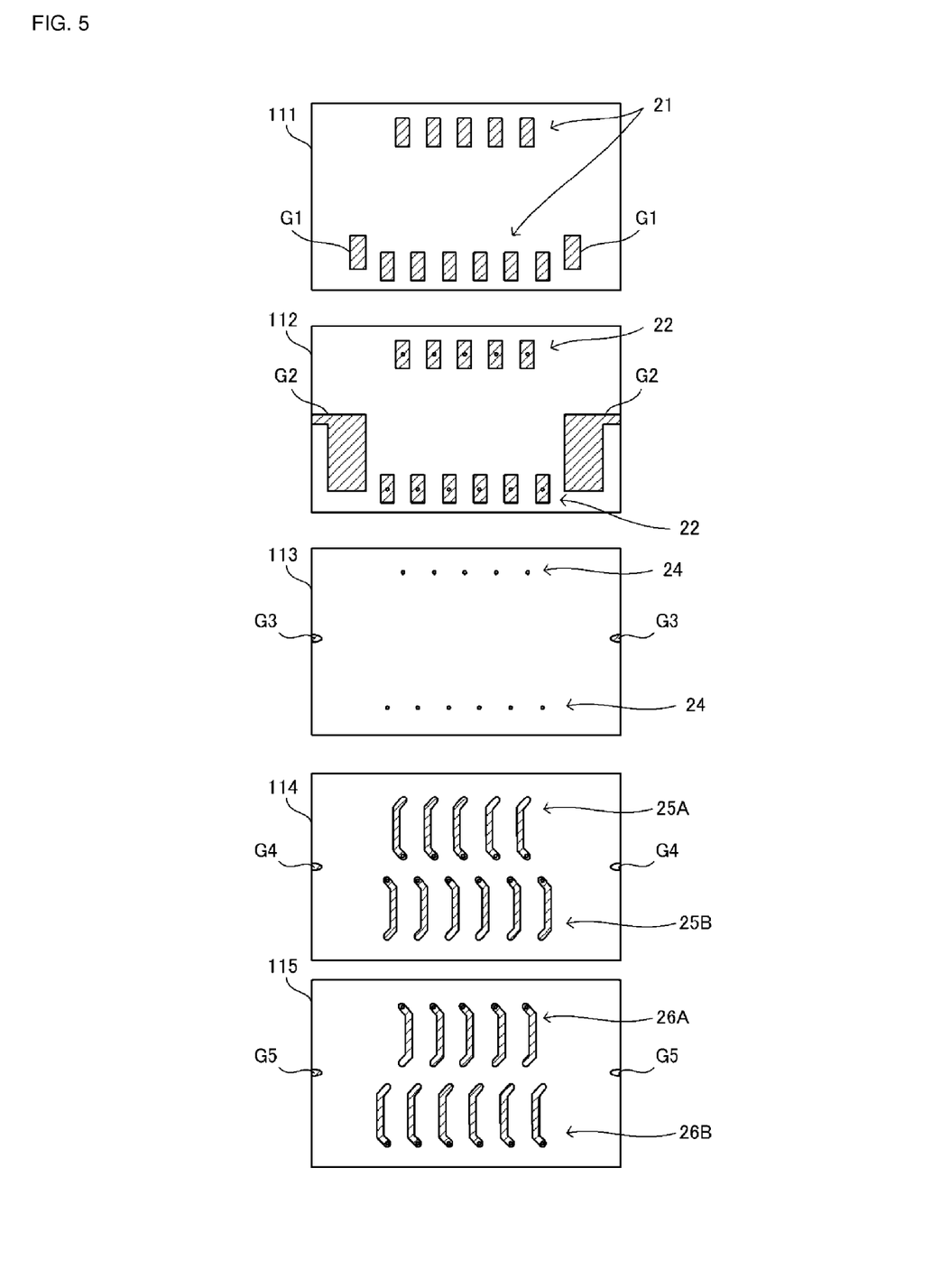
FIG. 5 illustrates magnetic layers to be stacked to define a substrate according to the first preferred embodiment of the present invention.
Figure 6:
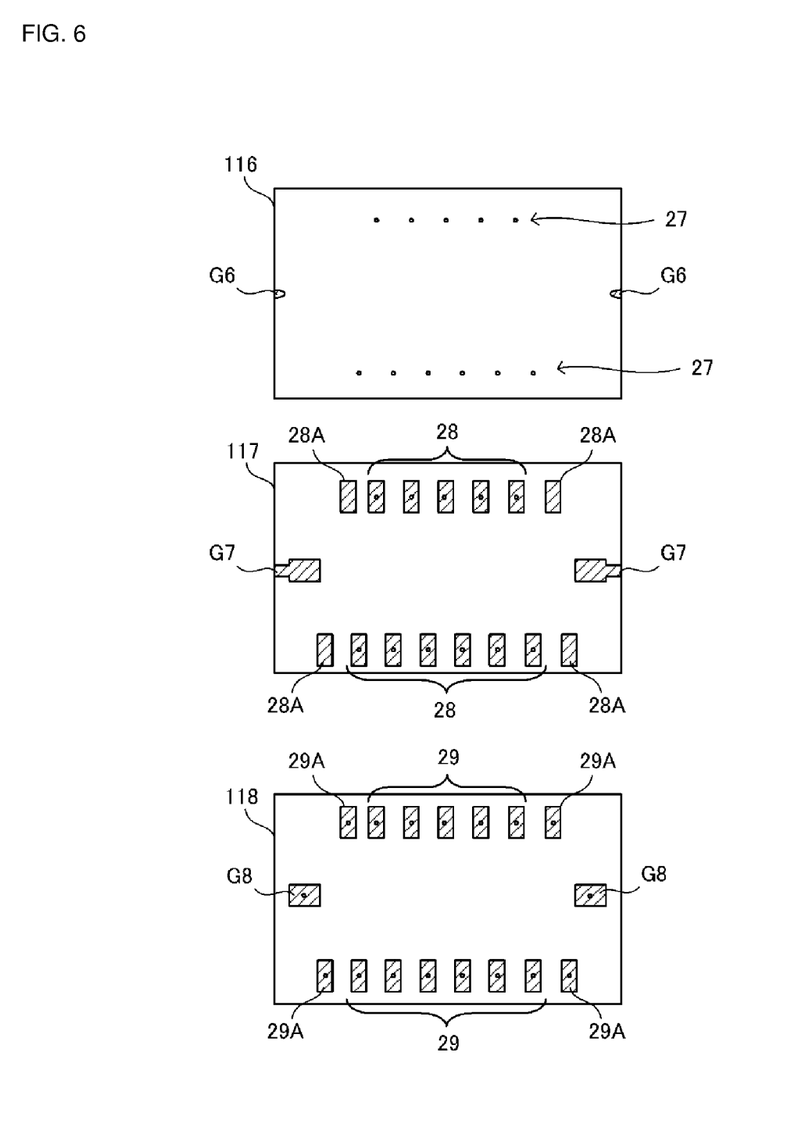
FIG. 6 illustrates other magnetic layers to be stacked to define the substrate according to the first preferred embodiment of the present invention.

FIGS. 5 and 6 illustrate magnetic layers to be stacked to define the substrate 11 according to the present preferred embodiment.

The substrate 11 is preferably formed by stacking rectangular or substantially rectangular magnetic layers 111, 112, 113, 114, 115, 116, 117, and 118 in order. In the following description, the magnetic layer 111 stacked as above is described as an upper side. The upper principal surface of the magnetic layer 111 is a principal surface on which the surface mount connector 10 is mounted. The lower principal surface of the magnetic layer 118 is a principal surface mounted on the printed circuit board 100. Note that the same principal surfaces of the magnetic layers 111 to 118 are not shown in FIGS. 5 and 6. Specifically, the upper principal surfaces of the magnetic layers 111 to 116 and the lower principal surfaces of the magnetic layers 117 and 118 are shown in FIGS. 5 and 6.

First, ground lines provided in the substrate 11 will be described.

Ground electrodes G1 are provided on the magnetic layer 111. Ground connection terminal pins of the surface mount connector 10 are connected to the ground electrodes G1. Ground electrodes G2 are provided on the magnetic layer 112. The ground electrodes G2 are arranged at positions overlapping the respective ground electrodes G1 on the magnetic layer 111 in plan view, and connected by via-hole conductors to the ground electrodes G1. The ground electrodes G2 partially extend to, and are exposed from, respective sides of the magnetic layer 112.

Side electrodes G3, G4, G5, and G6 are provided on corresponding sides of the magnetic layers 113, 114, 115, and 116. The side electrodes G3 are connected to the respective portions of the ground electrodes G2 exposed from the respective sides of the magnetic layer 112. The side electrodes G4 are connected to the respective side electrodes G5, which are connected to the respective side electrodes G6.

Ground electrodes G7 are provided on the magnetic layer 117. The ground electrodes G7 are partially exposed from respective sides of the magnetic layer 117, and the exposed portions are connected to the respective side electrodes G6. Ground outer electrodes G8 are provided on the magnetic layer 118. The ground outer electrodes G8 are connected by via-hole conductors to the respective ground electrodes G7. The ground outer electrodes G8 are then soldered to a ground wiring pattern on the printed circuit board.

As described above, in the process of being routed from the magnetic layer 111 to the magnetic layer 118, the ground lines are extended to the side surfaces of the substrate 11 (magnetic layers 112 to 117). The substrate 11 is a magnetic member, and when via-hole conductors are provided inside the magnetic member and the ground lines are routed therethrough, inductance components are produced in the ground lines. Routing the ground lines on the side surfaces of the substrate 11 reduces or prevents the inductance components from being produced in the ground lines.

Signal lines in the substrate 11 will now be described.

A plurality of (for example, 11 in the drawing) mounting electrodes 21 are provided on the magnetic layer 111. The mounting electrodes 21 are arranged at locations spaced in the direction ("predetermined direction" according to a preferred embodiment of the present invention) along the short sides of the principal surface of the magnetic layer 111. Specifically, five of the mounting electrodes 21 are provided along one long side of the principal surface of the magnetic layer, and six of the mounting electrodes 21 are provided along the other long side of the principal surface of the magnetic layer, for example. The mounting electrodes 21 correspond to the mounting electrodes 11A illustrated in FIG. 3. The connection terminal pins of the surface mount connector 10 are connected to the mounting electrodes 21.

Electrodes 22 are provided on the magnetic layer 112 at the same or substantially the same positions as the respective mounting electrodes 21 in plan view. The electrodes 22 are connected by via-hole conductors to the mounting electrodes 21.

Via-hole conductors 24 are provided on the magnetic layer 113. The via-hole conductors 24 connect the electrodes 22 on the magnetic layer 112 to a plurality of coil electrode patterns 25A and 25B (described below) provided on the magnetic layer 114.

The coil electrode patterns 25A and 25B are provided on the magnetic layer 114. Preferably, the coil electrode patterns 25A and 25B are both bow-shaped, and are curved in opposite directions. First ends of the coil electrode patterns 25A and 25B overlap the respective mounting electrodes 11A on the magnetic layer 114 in plan view. The via-hole conductors 24 on the magnetic layer 113 are connected to the respective first ends of the coil electrode patterns 25A and 25B. The first ends of the coil electrode patterns 25A and 25B are thus connected, by the via-hole conductors 24 and the electrodes 22, to the respective mounting electrodes 21.

A plurality of coil electrode patterns 26A and 26B are provided on the magnetic layer 115. Preferably, the coil electrode patterns 26A and 26B are bow-shaped. The coil electrode patterns 26A are curved in a direction opposite the coil electrode patterns 25A, and the coil electrode patterns 26B are curved in a direction opposite the coil electrode patterns 25B. First ends of the coil electrode patterns 26A are connected by via-hole conductors to the respective second ends of the coil electrode patterns 25A. First ends of the coil electrode patterns 26B are connected by via-hole conductors to the respective second ends of the coil electrode patterns 25B.

While not shown, more than one magnetic layer 114 and more than one magnetic layer 115 are alternately stacked. The second ends of the coil electrode patterns 26A and 26B are connected by via-hole conductors to the respective first ends of the coil electrode patterns 25A and 25B on the magnetic layer 114 stacked below the magnetic layer 115. Then, the coil electrode patterns 25A and 26A define coils each wound around a winding axis parallel or substantially parallel to the stacking direction of the magnetic layers. Similarly, the coil electrode patterns 25B and 26B define coils each wound around a winding axis parallel or substantially parallel to the stacking direction of the magnetic layers. The helical coils defined by the coil electrode patterns 25A and 25B and the coil electrode patterns 26A and 26B correspond to the inductors 12 illustrated in FIG. 3. Adjacent ones of the plurality of coils are wound and connected such that their magnetic fields are in phase.

Via-hole conductors 27 are provided on the magnetic layer 116. The via-hole conductors 27 connect the first ends of the coil electrode patterns 26A and 26B on the magnetic layer 115 to respective electrodes 28 (described below) provided on the magnetic layer 117.

A plurality of (for example, 11 in the drawing) external mounting electrodes 29 are provided on the magnetic layer 118. The external mounting electrodes 29 correspond to the external mounting electrodes 11B illustrated in FIG. 3, and are connected to the wiring pattern 101 (see FIG. 2) on the printed circuit board 100. The electrodes 28 are provided on the magnetic layer 117 at the same or substantially the same positions as the respective external mounting electrodes 29 in plan view. The electrodes 28 are connected by via-hole conductors to the external mounting electrodes 29.

A plurality of (for example, four in the drawing) dummy mounting electrodes 29A are provided on the magnetic layer 118. Electrodes 28A are provided on the magnetic layer 117 at the same or substantially the same positions as the respective dummy mounting electrodes 29A in plan view. The electrodes 28A are connected by via-hole conductors to the dummy mounting electrodes 29A. With the dummy mounting electrodes 29A, it is possible, for example, to improve the strength of mounting to the printed circuit board.

Stacking the magnetic layers including the electrodes thereon produces the substrate 11 in which the inductors are connected between the mounting electrodes 21 and the external mounting electrodes 29. The mounting electrodes 21 and the external mounting electrodes 29 are both arranged at locations spaced in the direction along the short sides of the principal surface of the magnetic layer. This enables effective use of space in plan view and facilitates formation of a plurality of inductors.

In the present preferred embodiment, the coil electrode patterns 25A, 25B, 26A, and 26B are provided on the magnetic layers 114 and 115 such that the winding axis of each of the inductors 12 is parallel or substantially parallel to the stacking direction of the magnetic layers. However, the present invention is not limited to this. The electrode patterns may be provided on the magnetic layers such that the winding axis of each of the inductors 12 is parallel or substantially parallel to the planar direction (i.e., direction along the principal surface) of the magnetic layers. The number of turns of the coils may be appropriately changed. The number of turns of the coils can be changed by changing the number of the magnetic layers 114 and 115 that are stacked.

Although the coil electrode patterns are provided on all of the paths between the mounting electrodes 21 and the external mounting electrodes 29 corresponding thereto in the present preferred embodiment, the coil electrode patterns do not necessarily need to be provided on all of the paths. Although all of the layers of the multilayer substrate are magnetic layers in the present preferred embodiment, the uppermost and lowermost layers may be non-magnetic layers, or a non-magnetic layer may be provided in the middle of the coil electrode patterns.

Second Preferred Embodiment

Figure 7:
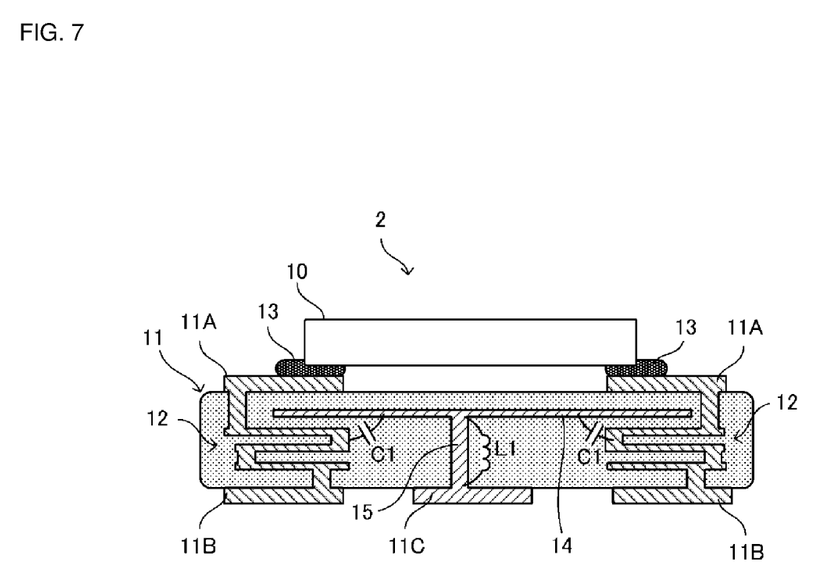
FIG. 7 is a cross-sectional view of a connector module according to a second preferred embodiment of the present invention.

FIG. 7 is a cross-sectional view of a connector module 2 according to a second preferred embodiment of the present invention.

The connector module 2 includes the surface mount connector 10 and the substrate 11 integral with each other. The mounting electrodes 11A are provided on one principal surface of the substrate 11 including a plurality of magnetic layers that are stacked, and the external mounting electrodes 11B are provided on the other principal surface of the substrate 11. The mounting electrodes 11A are connected by the solder 13 to the connection terminal pins of the surface mount connector 10. The external mounting electrodes 11B are mounted onto the wiring pattern provided on the printed circuit board.

A ground connection electrode 11C is provided on the other principal surface of the substrate 11. The ground connection electrode 11C is mounted on the ground wiring pattern on the printed circuit board. The ground connection electrode 11C corresponds to a "second external connection terminal" according to a preferred embodiment of the present invention.

The substrate 11 includes the inductors 12. The inductors 12 are each wound around a winding axis parallel or substantially parallel to the stacking direction of the magnetic layers. The inductors 12 are each connected at the first end thereof to a corresponding one of the mounting electrodes 11A and connected at the second end thereof to a corresponding one of the external mounting electrodes 11B.

A ground electrode 14 is provided on a magnetic layer of the substrate 11. The ground electrode 14 is provided above the inductors 12 (i.e., adjacent to the mounting electrodes 11A) in the stacking direction of the magnetic layers, and overlaps the inductors 12 in plan view. The ground electrode 14 is connected by a via-hole conductor 15 to the ground connection electrode 11C. The via-hole conductor 15 corresponds to an "interlayer connection conductor" according to a preferred embodiment of the present invention.

In the connector module 2 structured as described above, a stray capacitance C1 is produced between the ground electrode 14 and the inductors 12. The via-hole conductor 15 includes an inductance component L1. The stray capacitance C1 and the inductance component L1 define an LC resonant circuit, which is connected by the ground connection electrode 11C to the ground.

Figure 8:
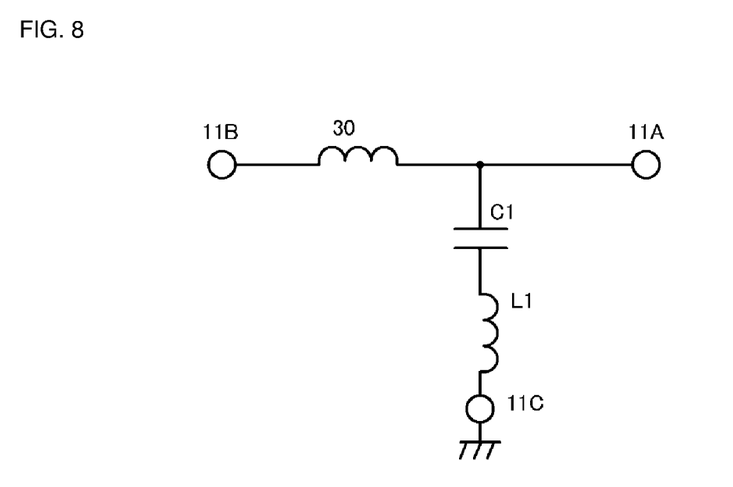
FIG. 8 illustrates an equivalent circuit of the connector module.

FIG. 8 illustrates an equivalent circuit of the connector module 2. The connector module 2 includes the stray capacitance C1 and the inductance component L1 as described above. Thus, as illustrated in FIG. 8, the connector module 2 has a configuration in which the LC resonant circuit connected to the ground is connected to the inductors 12. That is, the connector module 2 provides a filter function (e.g., low pass filter).

Locating the ground electrode 14 above the inductors 12 increases the inductance component L1, because the distance between the via-hole conductor 15 and the ground connection electrode 11C is long. The ground electrode 14 may be located below the inductors 12 (i.e., adjacent to the external mounting electrodes 11B), and this reduces the inductance component L1.

Figure 9:
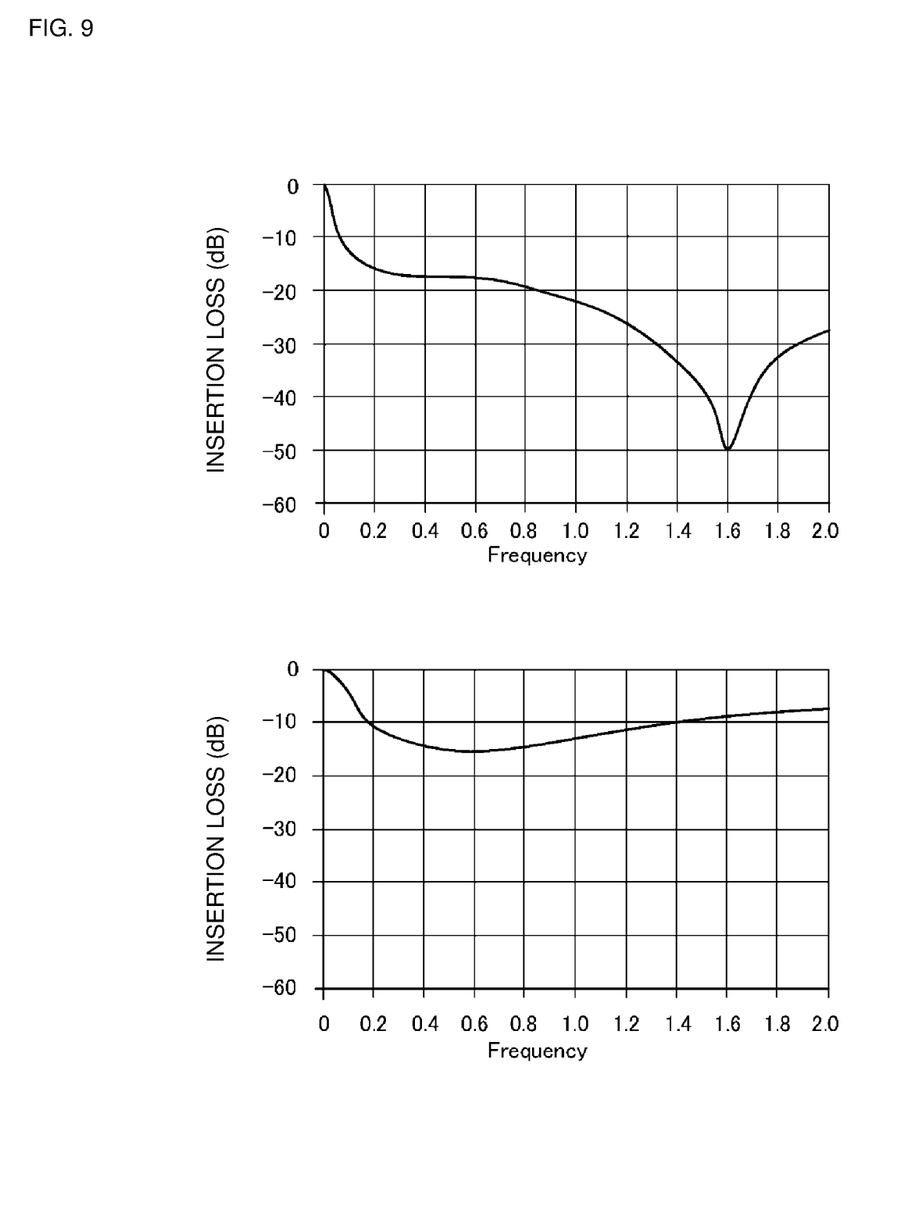
FIG. 9 illustrates frequency characteristics of an insertion loss of the connector module according to the second preferred embodiment of the present invention.

FIG. 9 illustrates frequency characteristics of an insertion loss of the connector module 2 according to the present preferred embodiment. For comparison, the lower graph of FIG. 9 shows frequency characteristics of a connector module that provides no filter function. As shown in FIG. 9, an attenuation pole is provided in a desired band in the frequency characteristics of the connector module 2 including an LC resonant circuit. The connector module 2 thus eliminates high-frequency noise in the desired band superimposed on signal lines between the mounting electrodes 11A and the external mounting electrodes 11B. For example, providing an attenuation pole at around 1.6 GHz reduces or eliminates adverse effects on cellular-band communication circuits.

The connector module 2 includes the mounting electrodes 11A, the external mounting electrodes 11B, and a plurality of signal lines. When the ground faces a portion of the coil electrode pattern in each line, a capacitive component is able to be added to each signal line. Additionally, when the ground electrode 14 is connected to the ground connection electrode 11C by a via-hole conductor passing through the magnetic layers, the filter function is able to be added to all of the signal lines. This eliminates the need to include a plurality of inductances (L components) which are elements of the LC resonant circuit, and makes it possible to achieve space saving.

The substrate 11, the inductors 12, and the ground electrode 14 of the connector module 2 are illustrated in a simplified manner in FIG. 7. A detailed description of the substrate 11, the inductors 12, and the ground electrode 14 is provided below.

Figure 10:
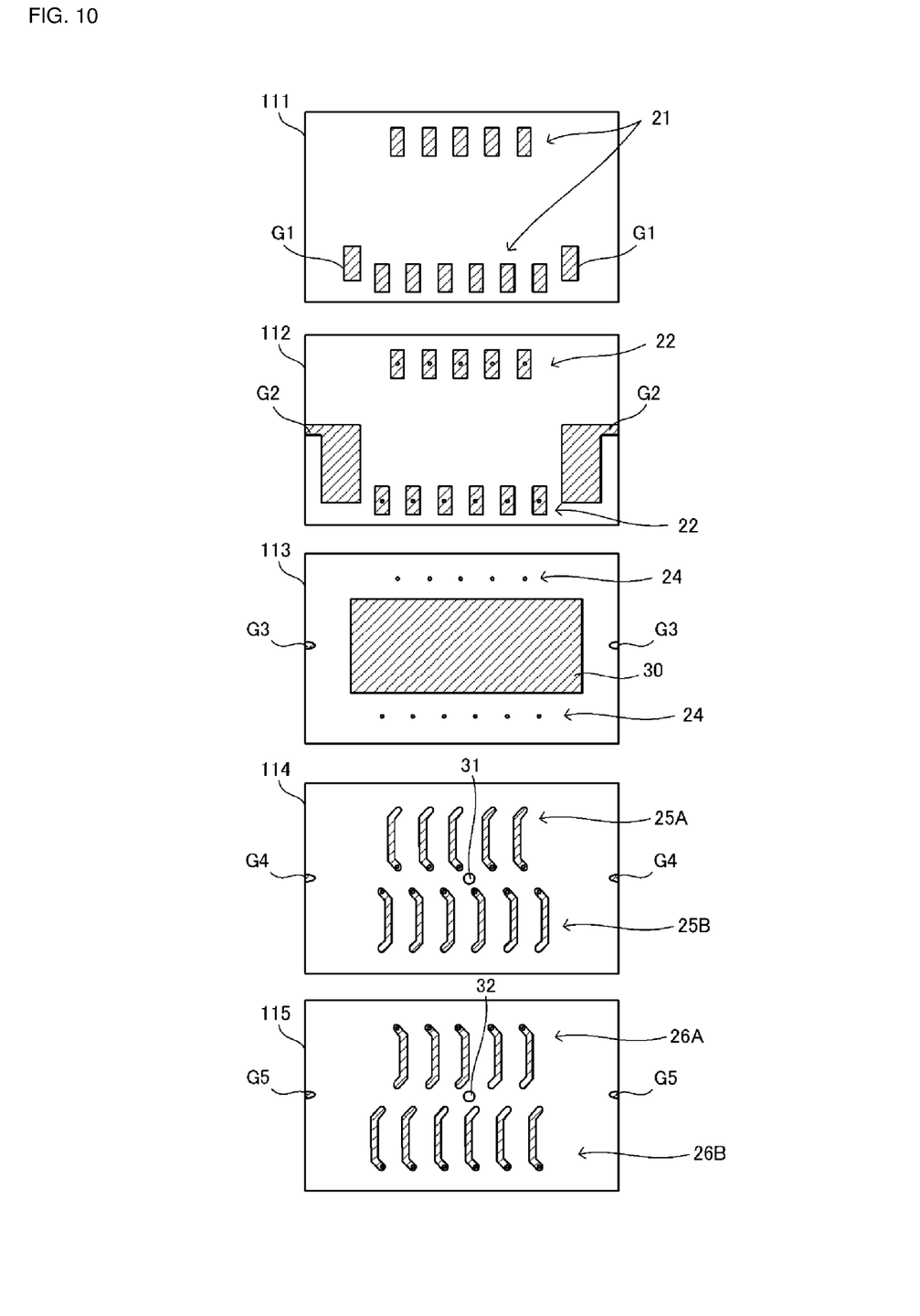
FIG. 10 illustrates magnetic layers to be stacked to define a substrate according to the second preferred embodiment of the present invention.
Figure 11:
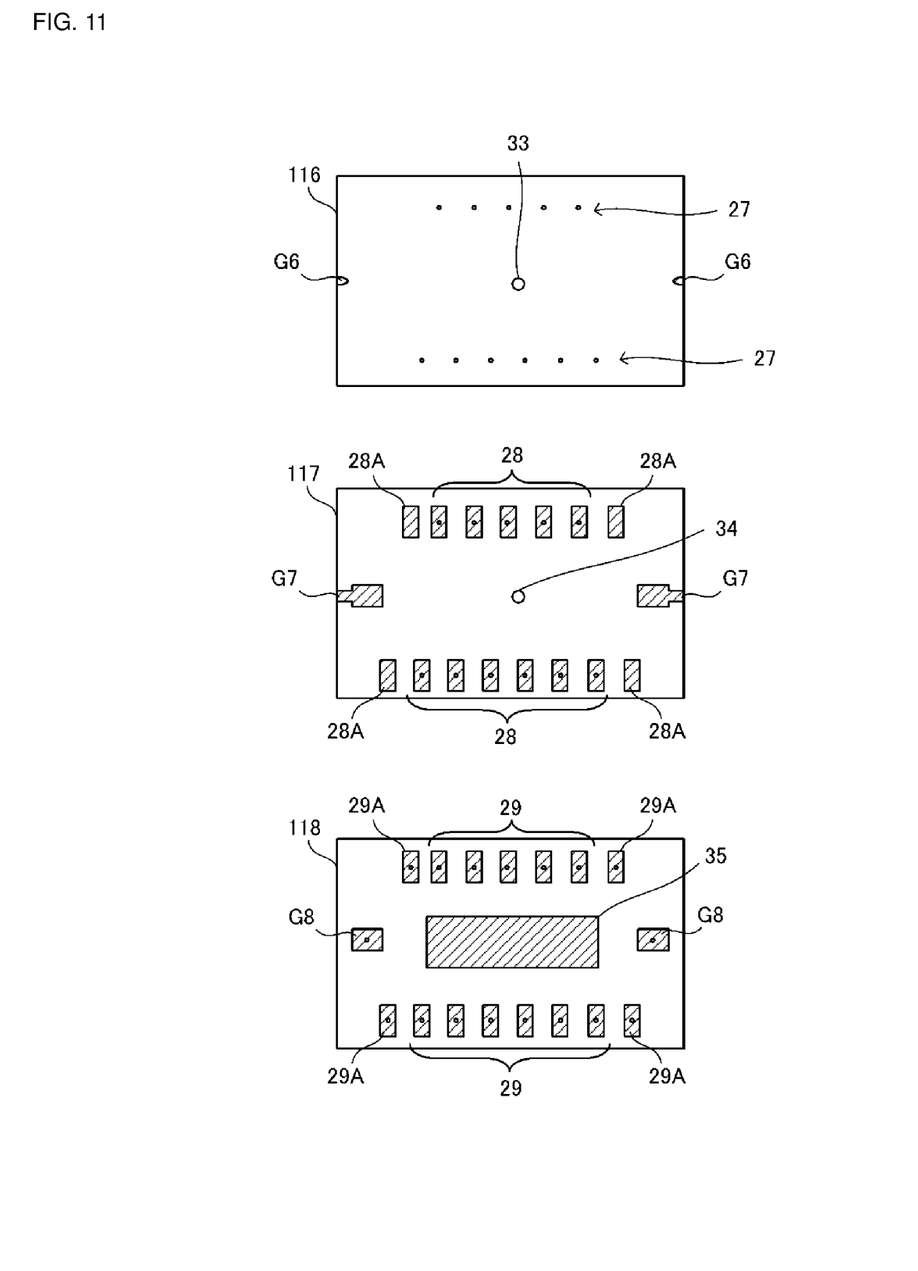
FIG. 11 illustrates other magnetic layers to be stacked to define the substrate according to the second preferred embodiment of the present invention.

FIGS. 10 and 11 illustrate magnetic layers to be stacked to form the substrate 11 according to the present preferred embodiment. The ground lines and signal lines provided on the stacked magnetic layers 111 to 118 will not be described here, as they are similar to those in the first preferred embodiment.

A ground electrode 30 is provided on the magnetic layer 113. The ground electrode 30 is located at a position overlapping the coil electrode patterns 25A, 25B, 26A, and 26B on the magnetic layers 114 and 115 in plan view. The ground electrode 30 corresponds to the ground electrode 14 illustrated in FIG. 7.

Via-hole conductors 31, 32, 33, and 34 are provided on the magnetic layers 114, 115, 116, and 117, respectively. A ground connection electrode 35 is provided on the magnetic layer 118. The via-hole conductors 31 to 34 connect the ground electrode 30 to the ground connection electrode 35. The via-hole conductors 31 to 34 correspond to the via-hole conductor 15 illustrated in FIG. 7. The ground connection electrode 35 corresponds to the ground connection electrode 11C illustrated in FIG. 7, and is soldered to the ground wiring pattern on the printed circuit board.

As described above, the ground electrode 30 is provided on a different layer from those including the coil electrode patterns 25A thereon. This arrangement simplifies the routing of electrodes on each magnetic layer. Also, since the ground electrode 30 is positioned between the mounting electrodes 21 and the coil electrode patterns 25A, the coils (corresponding to the inductors 12) defined by the coil electrode patterns 25A are shielded from the mounting electrodes 21.

As described above, the substrate 11 is preferably formed by stacking the magnetic layers including the electrodes provided thereon.

Although the ground electrode 14 is disposed above the inductors 12 in the present preferred embodiment, the ground electrode 14 may be provided both above and below the inductors 12 to increase the stray capacitance C1. The shape of the coil electrode patterns defining the inductors 12 may be modified to increase the stray capacitance C1.

Figure 12:
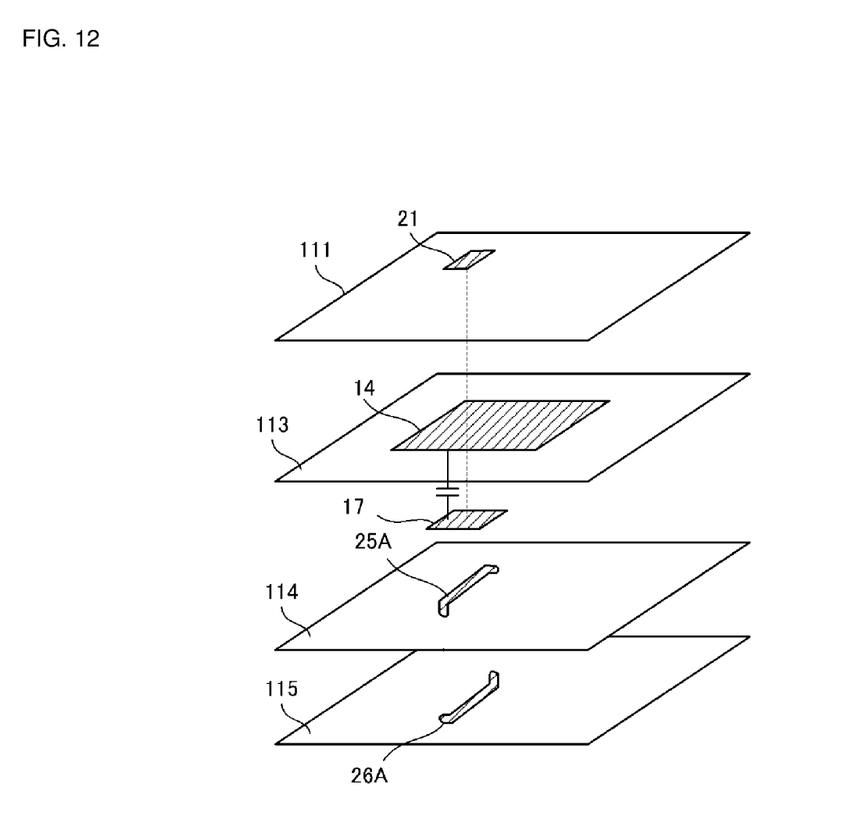
FIG. 12 illustrates an example in which the shape of coil electrode patterns are modified to increase stray capacitance.

FIG. 12 illustrates an example in which the shapes of coil electrode patterns are modified to increase the stray capacitance C1.

In this example, a rectangular or substantially rectangular electrode 17 is provided between the ground electrode 14 and the coil electrode pattern 25A. The electrode 17 may be provided on an additional magnetic layer stacked between the magnetic layers 113 and 114. When the ground electrode 14 is provided on the upper principal surface of the magnetic layer 113, the electrode 17 may be provided on the lower principal surface of the magnetic layer 113. When the coil electrode pattern 25A is provided on the lower principal surface of the magnetic layer 114, the electrode 17 may be provided on the upper principal surface of the magnetic layer 114.

The electrode 17 is connected by a via-hole conductor to the mounting electrode 21 and the coil electrode pattern 25A. The electrode 17 then defines a coil (corresponding to the inductors 12) together with the coil electrode patterns 25A and 26A. That is, the electrode 17 defines a portion (one end) of the coil. The stray capacitance C1 is increased in this case, because the area in which the ground electrode 14 and the electrode 17 face each other is greater than the area in which the ground electrode 14 and the coil electrode pattern 25A face each other.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A connector module comprising:
   a substrate including a plurality of stacked magnetic layers, a first principal surface, and a second principal surface opposite to the first principal surface;
   a plurality of mounting electrodes disposed on the first principal surface of the substrate;
   a plurality of first external connection terminals disposed on the second principal surface of the substrate; and
   at least one inductance element provided inside the stacked magnetic layers and disposed between the mounting electrodes and the first external connection terminals; wherein
   at least one of the mounting electrodes and at least one of the first external connection terminals are connected, with the inductance element connected therebetween;
   the substrate is mounted on a printed circuit board, with the plurality of first external connection terminals interposed therebetween; and
   the plurality of mounting electrodes are connected to a cable.

2. The connector module according to claim 1, wherein
   the plurality of first external connection terminals are provided on the second principal surface to correspond to the respective mounting electrodes; and
   a plurality of inductance elements are provided inside the substrate, the inductance elements each being positioned between a corresponding one of the mounting electrodes and a corresponding one of the first external connection terminals.

3. The connector module according to claim 2, wherein
   the mounting electrodes are spaced apart from each other in a predetermined direction of the first principal surface;
   the first external connection terminals are located at positions opposite to the respective mounting electrodes; and
   the inductance elements are located between the mounting electrodes and the first external connection terminals.

4. The connector module according to claim 1, wherein
   the plurality of first external connection terminals are provided on the second principal surface to correspond to the respective mounting electrodes; and the at least one of the mounting electrodes and the at least one of the first external connection terminals are connected by a wire routed along a side surface of the substrate.

5. The connector module according to claim 1, wherein the inductance element is a coil conductor pattern wound around a winding axis parallel or substantially parallel to a stacking direction of the magnetic layers.

6. The connector module according to claim 1, further comprising a ground conductor provided in the substrate and overlapping the inductance element in a stacking direction of the magnetic layers.

7. The connector module according to claim 6, wherein the ground conductor is located between the inductance element and the first principal surface.

8. The connector module according to claim 7, further comprising:
a second external connection terminal disposed on the second principal surface of the substrate; and
an interlayer connection conductor provided in the substrate and connecting the ground conductor to the second external connection terminal.

9. The connector module according to claim 1, further comprising a surface mount connector mounted on the substrate.

10. The connector module according to claim 9, wherein the surface mount connector is a female connector to be attached to and detached from a male connector connected to the cable, and the cable is a flexible cable.

11. The connector module according to claim 9, wherein the surface mount connector is a horizontal insertion surface mount connector including an insertion slot on one side to receive the cable and a retainer on another side to retain the cable, and the cable is a flexible cable.

12. A structure for connecting a flexible cable to a printed circuit board, the structure comprising:
a printed circuit board;
a multilayer substrate including a plurality of magnetic layers, a first principal surface, a second principal surface opposite to the first principal surface, a plurality of first-principal-surface-side connection terminals disposed on the first principal surface of the multilayer substrate, and a plurality of second-principal-surface-side connection terminals on the second principal surface, the multilayer substrate being mounted on the printed circuit board, with the plurality of second-principal-surface-side connection terminals interposed therebetween; and
a flexible cable connected to the plurality of first-principal-surface-side connection terminals; wherein
the multilayer substrate includes a plurality of inductance elements provided inside the magnetic layers, the inductance elements each being positioned between a corresponding one of the first-principal-surface-side connection terminals and a corresponding one of the second-principal-surface-side connection terminals.

13. The structure for connecting a flexible cable to a printed circuit board according to claim 12, wherein
the first-principal-surface-side connection terminals are spaced apart from one another in a predetermined direction of the first principal surface; and
the second-principal-surface-side connection terminals are located opposite to the respective first-principal-surface-side connection terminals.

14. The structure for connecting a flexible cable to a printed circuit board according to claim 12, wherein at least one of the first-principal-surface-side connection terminals and at least one of the second-principal-surface-side connection terminals are connected by a wire routed along a side surface of the multilayer substrate.

15. The structure for connecting a flexible cable to a printed circuit board according to claim 12, wherein the inductance elements are coil conductor patterns each wound around a winding axis parallel or substantially parallel to a stacking direction of the magnetic layers.

16. The structure for connecting a flexible cable to a printed circuit board according to claim 12, wherein the multilayer substrate includes a ground conductor provided inside the magnetic layers and overlapping the inductance elements in a stacking direction of the magnetic layers.

17. The structure for connecting a flexible cable to a printed circuit board according to claim 16, wherein the ground conductor is located between the inductance elements and the first principal surface.

18. The structure for connecting a flexible cable to a printed circuit board according to claim 17, further comprising an interlayer connection conductor provided in the multilayer substrate and connecting the ground conductor to at least one of the second-principal-surface-side connection terminals.

19. A module comprising:
a substrate including a plurality of magnetic layers, a first principal surface, and a second principal surface opposite to the first principal surface;
a plurality of mounting electrodes disposed on the first principal surface of the substrate;
a plurality of first external connection terminals disposed on the second principal surface to correspond to the respective mounting electrodes; and
at least one inductance element provided inside the magnetic layers and disposed between the mounting electrode and the first external connection terminal; wherein
at least one of the mounting electrodes and at least one of the first external connection terminals are connected, with the inductance element interposed therebetween; and
the at least one of the mounting electrodes and the at least one of the first external connection terminals are connected by a wire routed along a side surface of the substrate.

* * * * *